US012150262B2

(12) United States Patent
Zhu et al.

(10) Patent No.: US 12,150,262 B2
(45) Date of Patent: Nov. 19, 2024

(54) COMPOSITE STRUCTURE, FLEXIBLE DISPLAY ASSEMBLY, AND FOLDABLE DISPLAY TERMINAL

(71) Applicant: Huawei Technologies Co., Ltd., Shenzhen (CN)

(72) Inventors: Xu Zhu, Shanghai (CN); Wei Li, Dongguan (CN); Chunjun Ma, Shanghai (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 378 days.

(21) Appl. No.: 17/629,490

(22) PCT Filed: Jul. 21, 2020

(86) PCT No.: PCT/CN2020/103370
§ 371 (c)(1),
(2) Date: Jan. 24, 2022

(87) PCT Pub. No.: WO2021/013160
PCT Pub. Date: Jan. 28, 2021

(65) Prior Publication Data
US 2022/0295655 A1  Sep. 15, 2022

(30) Foreign Application Priority Data
Jul. 25, 2019 (CN) .......................... 201910678494.1

(51) Int. Cl.
H05K 5/04 (2006.01)
F28F 21/08 (2006.01)
(Continued)

(52) U.S. Cl.
CPC ............. *H05K 5/04* (2013.01); *F28F 21/089* (2013.01); *H05K 5/0017* (2013.01);
(Continued)

(58) Field of Classification Search
CPC ....... H05K 2201/10128; H05K 1/0283; H05K 5/04; H05K 5/0017; H05K 7/20963;
(Continued)

(56) References Cited

U.S. PATENT DOCUMENTS

2014/0295150 A1* 10/2014 Bower ................... B32B 25/20
428/411.1
2015/0023030 A1* 1/2015 Tsukamoto ........... G06F 1/1652
362/419
(Continued)

FOREIGN PATENT DOCUMENTS

CN 107507518 A 12/2017
CN 108520703 A 9/2018
(Continued)

Primary Examiner — Adam B Dravininkas
(74) Attorney, Agent, or Firm — Conley Rose, P.C.

(57) ABSTRACT

A composite structure includes a first layer and a second layer that are stacked, the first layer is configured to connect the second layer and a flexible display, and the second layer is configured to dissipate heat. Each of the first layer and the second layer includes a first surface and a second surface opposite to each other, where the first surface of the first layer is proximate to the flexible display, and the first surface of the second layer is proximate to the second surface of the first layer. An elastic modulus of the first layer is greater than or equal to an elastic modulus of the second layer, and a coefficient of thermal conductivity of the first layer is less than or equal to a coefficient of thermal conductivity of the second layer.

20 Claims, 5 Drawing Sheets

(51) Int. Cl.
*H05K 5/00* (2006.01)
*H05K 7/20* (2006.01)
*H10K 50/87* (2023.01)
*H10K 77/10* (2023.01)
*H10K 102/00* (2023.01)
*C09K 5/14* (2006.01)

(52) U.S. Cl.
CPC ........... *H05K 7/20963* (2013.01); *C09K 5/14* (2013.01); *H10K 50/87* (2023.02); *H10K 77/111* (2023.02); *H10K 2102/311* (2023.02)

(58) Field of Classification Search
CPC ............. H05K 7/20954; H10K 77/111; H10K 2102/311; H10K 50/844; H10K 59/12; H10K 59/8794; H10K 50/87; G06F 1/1652; G06F 1/203; G06F 1/1641; G06F 1/1616; G06F 2203/04102; G06F 1/1637; G06F 1/1618; H04M 1/0268; H04M 1/0214; H04M 1/0216; F28F 21/089
See application file for complete search history.

(56) References Cited

U.S. PATENT DOCUMENTS

| | | | |
|---|---|---|---|
| 2015/0138041 A1* | 5/2015 | Hirakata | G09G 5/14 |
| 2015/0179717 A1* | 6/2015 | Kawata | H01L 27/1266 |
| | | | 257/43 |
| 2015/0210590 A1* | 7/2015 | Chang | B32B 17/101 |
| | | | 428/220 |
| 2016/0212890 A1* | 7/2016 | Jeong | G06F 1/1652 |
| 2017/0222179 A1 | 8/2017 | Park | |
| 2018/0061893 A1* | 3/2018 | Breedlove | H10K 59/38 |
| 2019/0305237 A1* | 10/2019 | Shin | H04M 1/0268 |
| 2021/0185852 A1* | 6/2021 | Yang | H05K 7/2039 |
| 2021/0295747 A1 | 9/2021 | Jiang | |
| 2021/0337676 A1 | 10/2021 | Chu | |

FOREIGN PATENT DOCUMENTS

| | | |
|---|---|---|
| CN | 109036131 A | 12/2018 |
| CN | 109830185 A | 5/2019 |
| CN | 109859630 A | 6/2019 |
| CN | 110544431 A | 12/2019 |
| WO | 2019047383 A1 | 3/2019 |

* cited by examiner

COMPOSITE STRUCTURE, FLEXIBLE DISPLAY ASSEMBLY, AND FOLDABLE DISPLAY TERMINAL

CROSS-REFERENCE TO RELATED APPLICATIONS

This is a U.S. National Stage of International Patent Application No. PCT/CN2020/103370 filed on Jul. 21, 2020, which claims priority to Chinese Patent Application No. 201910678494.1 filed on Jul. 25, 2019. Both of the aforementioned applications are hereby incorporated by reference in their entireties.

TECHNICAL FIELD

Embodiments of this application relate to the field of displays, and in particular, to a composite structure, a flexible display assembly, and a foldable display terminal.

BACKGROUND

With continuous development of display technologies, foldable display terminals gradually become a development trend of mobile electronic products in the future. When a foldable display terminal is in an unfolded state, a relatively large display area can be obtained, to improve a viewing effect. When the foldable display terminal is in a folded state, a relatively small size can be obtained. This is convenient for a user to carry.

The foldable display terminal includes at least a flexible display and a supporting assembly configured to support the flexible display.

A shape and a stacked design in architecture of the foldable display terminal require that the supporting assembly have advantages such as high rigidity, a high coefficient of thermal conductivity, a light weight, and high weldability, and be formed with an ultra-thin wall. Currently, a single metal material cannot meet all the foregoing performance requirements.

SUMMARY

Embodiments of this application provide a composite structure, a flexible display assembly, and a foldable display terminal, to resolve a problem that performance of a supporting assembly is single.

To achieve the foregoing objective, the embodiments of this application use the following technical solutions.

According to a first aspect of the embodiments of this application, a composite structure is provided, where the composite structure is configured to support a flexible display, the composite structure includes a first layer and a second layer that are stacked, the first layer is configured to connect the second layer and the flexible display, and the second layer is configured to dissipate heat, where the first layer and the second layer each include a first surface and a second surface opposite to each other, where the first surface of the first layer is close to the flexible display, and the first surface of the second layer is close to the second surface of the first layer; and an elastic modulus of the first layer is greater than or equal to an elastic modulus of the second layer, and a coefficient of thermal conductivity of the first layer is less than or equal to a coefficient of thermal conductivity of the second layer. Therefore, the composite structure uses a multi-layer structure, an elastic modulus of the composite structure is greater than the elastic modulus of the second layer, and a coefficient of thermal conductivity of the composite structure is greater than the coefficient of thermal conductivity of the first layer, so that comprehensive performance of the composite structure is improved. Performance requirements such as high rigidity, a high coefficient of thermal conductivity, a light weight, and high weldability can all be met.

In an optional implementation, a material of the first layer is stainless steel or titanium alloy, and the first surface of the first layer is connected to the flexible display in a bonding manner. In this way, strength and impact resistance of the flexible display are improved.

In an optional implementation, a material of the second layer is aluminum alloy or copper alloy, and the first surface of the second layer is connected to the second surface of the first layer by using an atom bonding process. In this way, a connection between the first layer and the second layer is more stable.

In an optional implementation, the material of the first layer is stainless steel, the material of the second layer is aluminum alloy, a ratio of a thickness of the second layer to a total thickness of the composite structure is $1/5$ to $10/11$, an elastic modulus of the composite structure is 80.0 GPa to 165.8 GPa, a coefficient of thermal conductivity of the composite structure is 58.8 W/m·K to 210.5 Wm·K, and a density of the composite structure is 3.2 g/cm$^3$ to 6.9 g/cm$^3$. Therefore, compared with that only stainless steel is used in the conventional technology, heat dissipation performance is better, and a weight is lighter. Compared with that only aluminum alloy is used, the elastic modulus is larger, which helps improve welding performance and formability of the composite structure.

In an optional implementation, the material of the first layer is titanium alloy, the material of the second layer is aluminum alloy, a ratio of a thickness of the second layer to a total thickness of the composite structure is $1/5$ to $5/7$, an elastic modulus of the composite structure is 80.7 GPa to 101.8 GPa, a coefficient of thermal conductivity of the composite structure is 51.6 W/m·K to 166.3 W/m·K, and a density of the composite structure is 3.2 g/cm$^3$ to 4.1 g/cm$^3$. Therefore, compared with that only titanium alloy is used, heat dissipation performance is better, and a weight is lighter. Compared with that only aluminum alloy is used, the elastic modulus is larger, which helps improve welding performance and formability of the composite structure.

In an optional implementation, the material of the first layer is titanium alloy, the material of the second layer is copper alloy, a ratio of a thickness of the second layer to a total thickness of the composite structure is $1/8$ to $3/4$, an elastic modulus of the composite structure is 110.0 GPa, a coefficient of thermal conductivity of the composite structure is 53.6 W/m·K to 286.8 W/m·K and a density of the composite structure is 5.1 g/cm$^3$ to 7.8 g/cm$^3$. Therefore, compared with that only titanium alloy is used, heat dissipation performance is better. Compared with that only copper alloy is used, the elastic modulus is unchanged, and a weight is lighter.

In an optional implementation, the composite structure further includes a third layer configured to support the second layer, where the third layer is disposed adjacent to the second surface of the second layer, and an elastic modulus of the third layer is greater than or equal to the elastic modulus of the second layer. Therefore, the second layer can be protected, to improve strength of the composite structure.

In an optional implementation, a material of the third layer is stainless steel, titanium alloy, or copper alloy, and the third layer is connected to the second surface of the second layer by using the atom bonding process. In this way, a connection between the third layer and the second layer is more stable.

In an optional implementation, the material of the first layer is stainless steel, the material of the second layer is aluminum alloy, the material of the third layer is stainless steel, a ratio of the thickness of the second layer to the total thickness of the composite structure is ⅕ to ¹⁰⁄₁₁, the elastic modulus of the composite structure is 80.0 GPa to 165.8 GPa, the coefficient of thermal conductivity of the composite structure is 58.8 W/m·K to 210.5 W/m·K, and the density of the composite structure is 3.2 g/cm³ to 6.9 g/cm³. Therefore, compared with that a composite structure with a first layer made of a stainless steel material and a second layer made of an aluminum alloy material is used, the third layer is disposed on a side of the second layer that is away from the first layer, so that rigidity of the supporting assembly at this location is increased. This helps improve welding performance and formability of the supporting assembly.

In an optional implementation, a thickness ratio of the first layer, the second layer, and the third layer is 1:1:1, 1:1:2, 1:2:1, 1:2:2, 1:3:1, 1:4:1, or 2:1:2.

In an optional implementation, the material of the first layer is titanium alloy, the material of the second layer is copper alloy, the material of the third layer is titanium alloy, a ratio of the thickness of the second layer to the total thickness of the composite structure is ⅛ to ¾, the elastic modulus of the composite structure is 110 GPa, the coefficient of thermal conductivity of the composite structure is 53.6 W/m·K to 286.8 W/m·K, and the density of the composite structure is 5.1 g/cm³ to 7.8 g/cm³. Therefore, compared with that a composite structure with a first layer made of a titanium alloy material and a second layer made of a copper alloy material is used, the third layer is disposed on a side of the second layer that is away from the first layer, so that rigidity of the supporting assembly at this location is increased. This helps improve welding performance and formability of the supporting assembly.

In an optional implementation, a thickness ratio of the first layer, the second layer, and the third layer is 1:1:1, 1:1:2, 1:2:1, 1:2:2, or 2:1:2.

In an optional implementation, the material of the first layer is titanium alloy, the material of the second layer is aluminum alloy, the material of the third layer is titanium alloy, a ratio of the thickness of the second layer to the total thickness of the composite structure is ⅕ to ⁵⁄₇, the elastic modulus of the composite structure is 80.7 GPa to 101.8 GPa, the coefficient of thermal conductivity of the composite structure is 51.6 W/m·K to 166.3 W/m·K, and the density of the composite structure is 3.2 g/cm³ to 4.1 g/cm³. Therefore, compared with that a composite structure with a first layer made of a titanium alloy material and a second layer made of an aluminum alloy material is used, the third layer is disposed on a side of the second layer that is away from the first layer, so that rigidity of the supporting assembly at this location is increased. This helps improve welding performance and formability of the supporting assembly.

In an optional implementation, a thickness ratio of the first layer, the second layer, and the third layer is 1:1:1, 1:1:2, 1:2:1, 1:2:2, 1:3:1, 1:4:1, or 2:1:2.

In an optional implementation, the material of the first layer is stainless steel, the material of the second layer is aluminum alloy, the material of the third layer is titanium alloy, a ratio of the thickness of the second layer to the total thickness of the composite structure is ⅕ to ⅚, the elastic modulus of the composite structure is 82.5 GPa to 133.8 GPa, the coefficient of thermal conductivity of the composite structure is 55.2.6 W/m·K to 193.6 W/m·K, and the density of the composite structure is 3.3 g/cm³ to 5.5 g/cm³. Therefore, compared with that a composite structure with a first layer made of a stainless steel material and a second layer made of an aluminum alloy material is used, the third layer is disposed on a side of the second layer that is away from the first layer, so that rigidity of the supporting assembly at this location is increased. This helps improve welding performance and formability of the supporting assembly.

In an optional implementation, the material of the first layer is stainless steel, the material of the second layer is aluminum alloy, the material of the third layer is copper alloy, a ratio of the thickness of the second layer to the total thickness of the composite structure is ⅓ to ⅞, the elastic modulus of the composite structure is 87.0 GPa to 123.0 GPa, the coefficient of thermal conductivity of the composite structure is 208.7 W/m·K to 222.9 W/m·K, and the density of the composite structure is 4.0 g/cm³ to 6.5 g/cm³. Therefore, compared with that a composite structure with a first layer made of a stainless steel material and a second layer made of an aluminum alloy material is used, the third layer is disposed on a side of the second layer that is away from the first layer, so that rigidity of the supporting assembly at this location is increased. This helps improve a thermal conductivity property of the supporting assembly.

According to a second aspect of the embodiments of this application, a flexible display assembly is provided. The flexible display assembly includes a flexible display, a first supporting component, and a second supporting component, where the first supporting component and the second supporting component are manufactured by using the foregoing composite structure. In this way, heat dissipation performance, rigidity, and impact resistance of the flexible display assembly are improved, and light-weighting of the flexible display assembly is also facilitated.

According to a third aspect of the embodiments of this application, a foldable display terminal is provided, including the foregoing flexible display assembly. A first non-bending region of the flexible display is connected to the first supporting component; a second non-bending region of the flexible display is connected to the second supporting component; and a bending region of the flexible display is located between the first non-bending region and the second non-bending region.

In an optional implementation, a stainless steel sheet is further disposed on the flexible display, and the stainless steel sheet includes a first fixed part connected to the first non-bending region, a second fixed part connected to the second non-bending region, and a bending part connected to the bending region, where the first fixed part, the second fixed part, and the bending part are integrally formed; and the first supporting component is connected to the first fixed part, and the second supporting component is connected to the second fixed part, in this way, strength and impact resistance of the flexible display are further improved.

In an optional implementation, the stainless steel sheet is connected to the flexible display in a bonding manner, and the first supporting component and the second supporting component are connected to the stainless steel sheet in a bonding or welding manner. In this way, connection stability of the foldable display terminal is improved.

DESCRIPTION OF EMBODIMENTS

Figure 1:
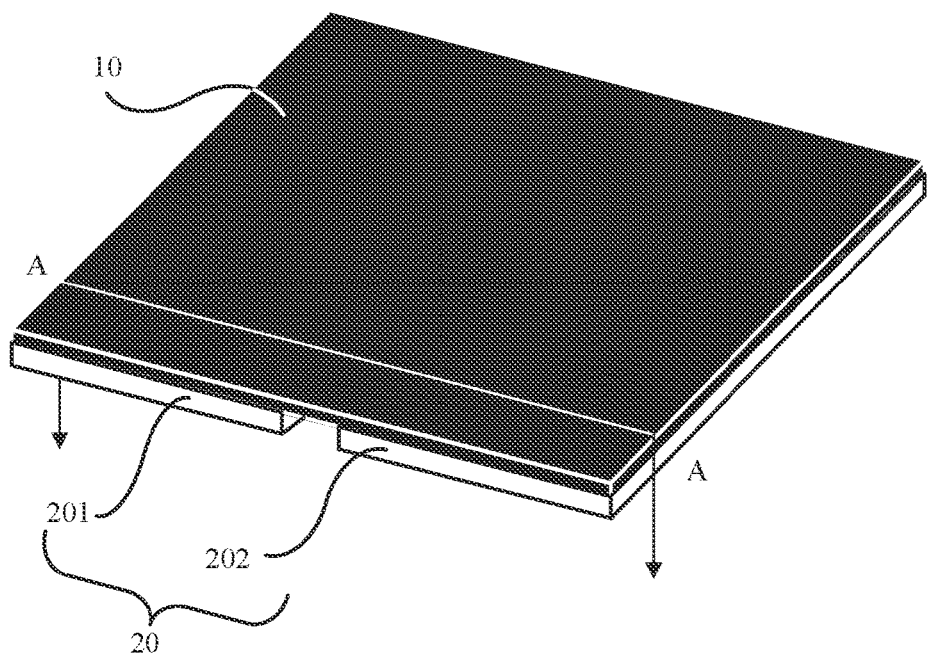
FIG. 1 is a schematic diagram of a structure of a foldable display terminal according to an embodiment of this application.

The following describes the technical solutions in the embodiments of this application with reference to the accompanying drawings in the embodiments of this application. It is clearly that the described embodiments are merely some rather than all of the embodiments of this application.

Hereinafter, terms "first", "second", and the like are used only for descriptive purposes, and cannot be understood as indicating or implying relative importance or implicitly indicating the quantity of indicated technical features. Therefore, features defined with "first", "second", and the like may explicitly or implicitly include one or more of the features. In the description of this application, unless otherwise described, "a plurality of" means two or more.

In addition, in this application, orientation terms such as "up" and "down" are defined relative to orientations in which components are schematically placed in the accompanying drawings. It should be understood that these directional terms are relative concepts, are intended to provide relative description and clarification, and may vary correspondingly based on changes of the orientations in which the components are placed in the accompanying drawings.

The following explains terms that may appear in the embodiments of this application.

Bonding is a technology in which two pieces of atomically-flat homogeneous or heterogeneous semiconductor materials with clean surfaces undergo surface cleaning and activation processing and are directly bonded under a specific condition, and wafers are bonded integrally based on van der Waals force, molecular force, or even atomic force.

A plasma cleaning machine, also referred to as a plasma cleaner or a plasma surface treatment instrument, uses a new high-tech technology in which plasmas are used to achieve an effect that cannot be achieved by a conventional cleaning method. Plasma represents a state of a substance, is also referred to as a fourth state of a substance, and does not belong to common three states: solid, liquid, and gas. When sufficient energy is applied to gas, the gas is ionized and turns into a plasma state. "Active" components of plasma include: ions, electrons, atoms, active groups, nuclides in an excited state (metastable state), photons, and the like. The plasma cleaning machine processes a surface of a sample based on properties of these active components, to implement cleaning, coating, and the like.

A vacuum rolling method is a method for rolling composite plates by performing assembly rolling under a high vacuum condition when surfaces of a carbon steel substrate and a stainless steel composite plate are in a physical purity state after undergoing blanking and surface treatment processing. Since the invention of the vacuum rolling method, the vacuum rolling method has been widely used in many developed countries to produce stainless steel composite plates and is gradually applied to other metal smelting.

Diffusion welding: Under effects of a temperature and a pressure, material surfaces in contact with each other approach each other and partially undergo plastic deformation, mutual diffusion occurs between atoms, and a new diffusion layer is formed at an interface, to achieve a reliable connection. The diffusion welding is divided into solid phase diffusion welding and liquid phase diffusion welding. (transient liquid phase diffusion welding, TLP welding). With development of material science in recent years, new materials emerge constantly. In production and application, problems of connections between new materials or between new materials and other materials usually arise. For example, it is very difficult to achieve reliable connections for ceramics, intermetallic compounds, amorphous materials, single crystal alloys, and the like by using conventional fusion welding methods.

An embodiment of this application provides a foldable display terminal. The foldable display terminal may be a product with a display interface, for example, a mobile phone, a display, a tablet computer, or a vehicle-mounted computer. A specific form of the foldable display terminal is not specially limited in this embodiment of this application.

As shown in FIG. 1, the foldable display terminal 01 includes a flexible display assembly. The flexible display assembly includes a flexible display 10 and a supporting assembly 20 configured to support the flexible display 10.

The flexible display 10 is an active matrix organic light emitting diode (active matrix organic light emitting diode, AMOLED) display.

As a self-luminescent display, the AMOLED display does not need to be provided with a back light module (back light module, BLM). Therefore, when a substrate in the AMOLED display is made of a flexible resin material, for example, polyethylene terephthalate (polyethylene terephthalate, PET), the AMOLED display can have a characteristic of bendability.

Figure 2:
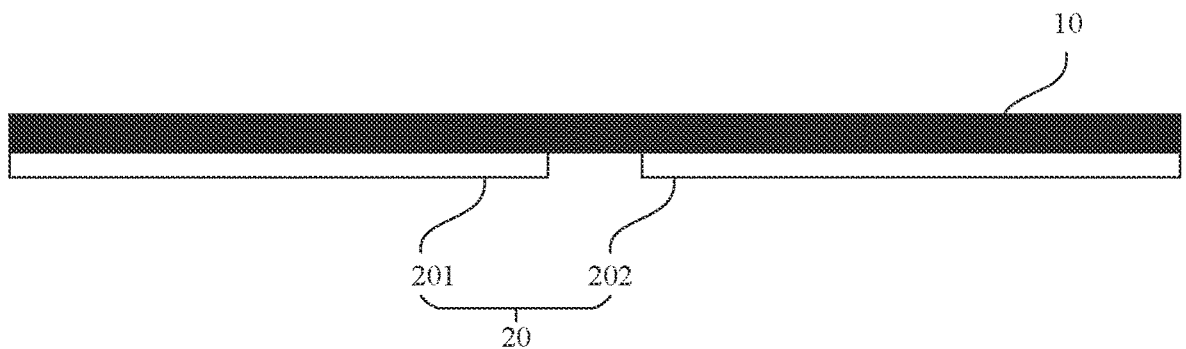
FIG. 2 is a cross-sectional diagram of a part A-A in FIG. 1.
Figure 3:
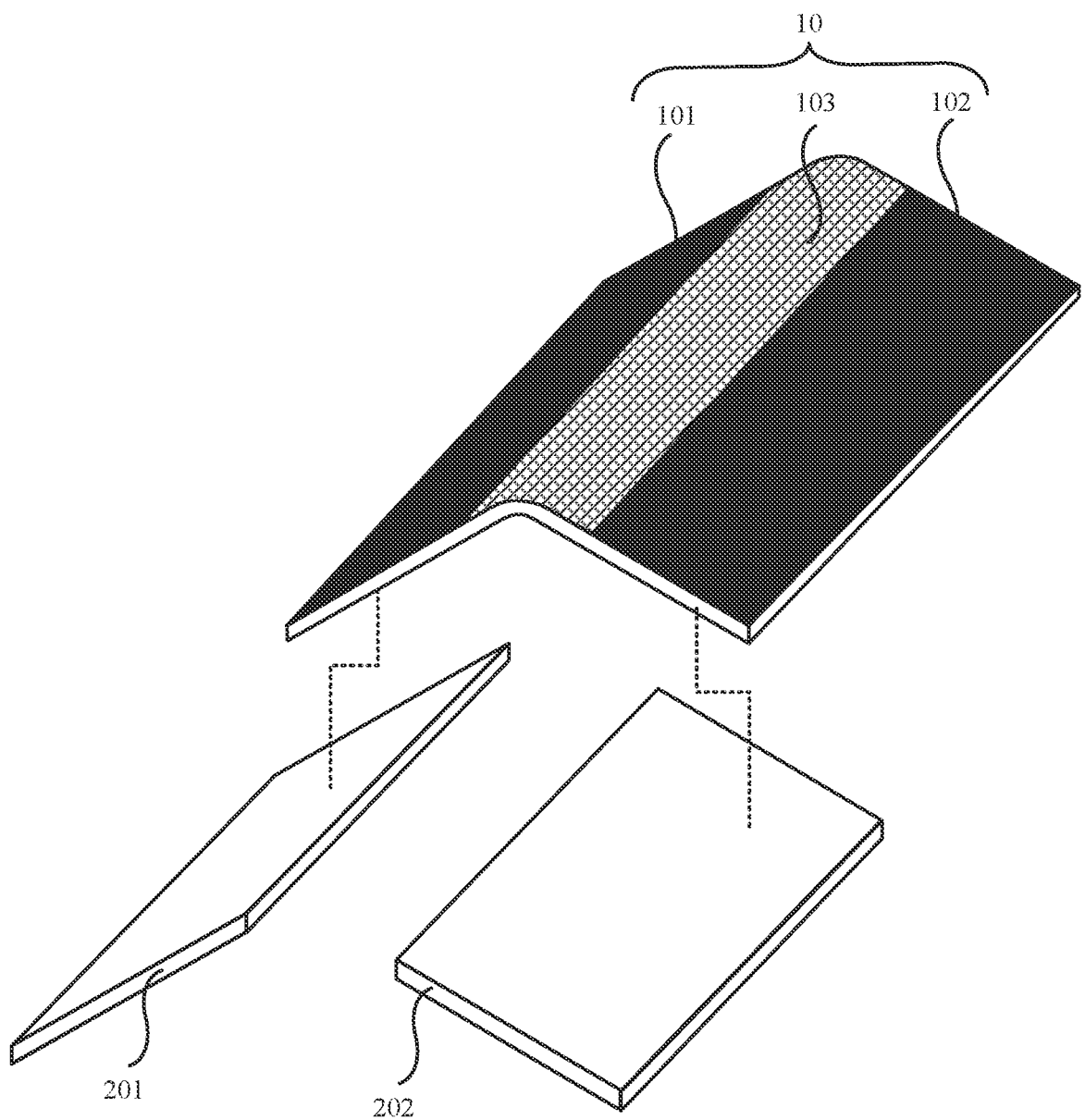
FIG. 3 is an exploded view of a foldable display terminal according to an embodiment of this application.

FIG. 2 is a cross-sectional diagram of a part A-A in FIG. 1. FIG. 3 is an exploded view of a foldable display terminal according to an embodiment of this application.

As shown in FIG. 1 and FIG. 2, the supporting assembly 20 includes at least a first supporting component 201 and a second supporting component 202.

As shown in FIG. 3, the flexible display 10 includes a first non-bending region 101, a second non-bending region 102, and a bending region 103. The bending region 103 is located between the first non-bending region 101 and the second non-bending region 102.

The first supporting component 201 is connected to the first non-bending region 101 of the flexible display 10, and the second supporting component 202 is connected to the second non-bending region 102 of the flexible display.

Figure 4:
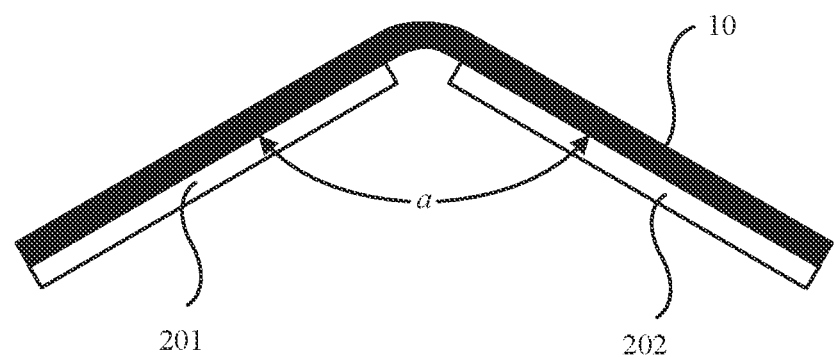
FIG. 4 is a diagram of a folded state of a foldable display terminal according to an embodiment of this application.

As shown in FIG. 4, when an included angle α between the first supporting component 201 and the second supporting component 202 is less than 180°, the flexible display 10 is in a bent state.

Figure 5:
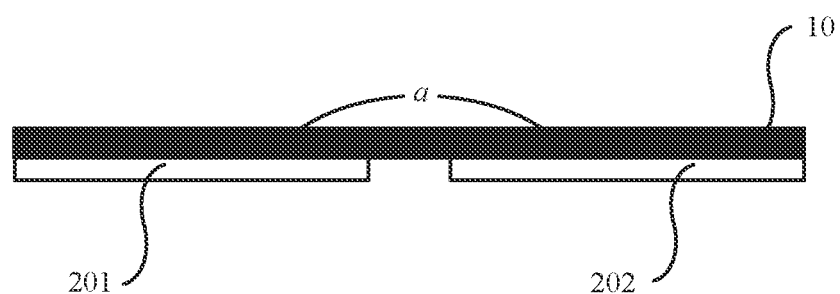
FIG. 5 is a diagram of an unfolded state of a foldable display terminal according to an embodiment of this application.

Alternatively, as shown in FIG. 5, when the included angle α between the first supporting component 201 and the second supporting component 202 is increased to 180°, the flexible display 10 is in an unfolded state.

The first supporting component 201 and the second supporting component 202 are configured to support the flexible display 10 in processes of unfolding and folding the flexible display 10, to ensure flatness of the flexible display 10, and protect a non-display surface of the flexible display 10.

Figure 6:
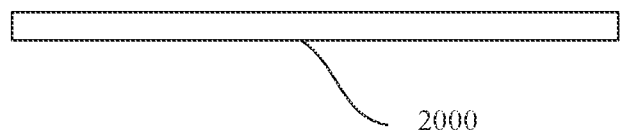
FIG. 6 is a schematic diagram of a structure of a supporting assembly according to the conventional technology.

As shown in FIG. 6, an existing first supporting component and an existing second supporting component are separately made of a single metal layer 2000. A material of the metal layer 2000 is, for example, copper alloy, aluminum alloy, stainless steel, titanium alloy, magnesium alloy, zinc alloy, or liquid metal.

The stainless steel has high rigidity, high strength, and good welding performance, and is easy to form, but has a poor heat dissipation capability and a high weight, and cannot meet requirements for heat dissipation and a light weight of the foldable display terminal.

The copper alloy has a good heat dissipation capability and is easy to form, but has poor welding performance and a high weight, and cannot meet a light weight requirement of the foldable display terminal.

The aluminum alloy has a good heat dissipation capability and a light weight, and is easy to form, but has poor rigidity, low strength, and poor welding performance, and cannot meet requirements for strength, rigidity, and welding of the foldable display terminal.

The titanium alloy has a light weight and good strength, but has a poor heat dissipation capability, poor rigidity, poor welding performance, and high forming difficulty, and cannot meet requirements for heat dissipation, rigidity, welding, and forming of the foldable display terminal.

The magnesium alloy has a light weight, but has poor rigidity, low strength, poor welding performance, poor heat dissipation performance, and high forming difficulty, and cannot meet requirements for rigidity, strength, welding, heat dissipation, and forming of the foldable display terminal.

The zinc alloy has poor rigidity, low strength, poor welding performance, poor heat dissipation performance, a high weight, and high forming difficulty, and cannot meet requirements for rigidity, strength, welding, heat dissipation, a light weight, and forming of the foldable display terminal.

The liquid metal has poor rigidity, low strength, poor welding performance, poor heat dissipation performance, a high weight, and high forming difficulty, and cannot meet requirements for rigidity, strength, welding, heat dissipation, a light weight, and forming of the foldable display terminal.

The single metal layer 2000 cannot simultaneously meet all the requirements for high rigidity, a high coefficient of thermal conductivity, a light weight, and good welding performance. Therefore, this embodiment of this application provides an improved supporting assembly.

Figure 7:
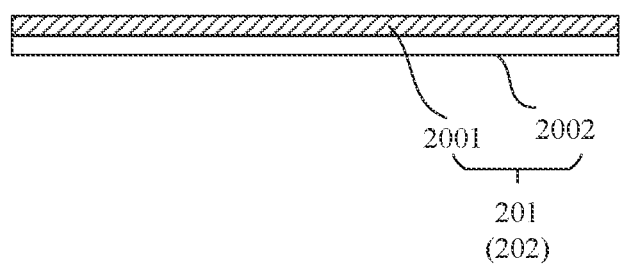
FIG. 7 is a schematic diagram of a structure of a supporting assembly according to an embodiment of this application.

As shown in FIG. 7, the first supporting component 201 and the second supporting component 202 are made of a composite structure. The composite structure includes a first layer 2001 and a second layer 2002 that are stacked. The first layer 2001 is configured to connect the flexible display and the second layer 2002, and the second layer 2002 is configured to dissipate heat.

The first layer 2001 may be made of a material different from that of the second layer 2002. An elastic modulus of the first layer 2001 may be greater than or equal to an elastic modulus of the second layer 2002, and a coefficient of thermal conductivity of the first layer 2001 may be less than or equal to a coefficient of thermal conductivity of the second layer 2002.

For example, the material of the first layer 2001 is, for example, stainless steel or titanium alloy. Components of the stainless steel include but are not limited to SUS301, SUS304, and SUS316L. An elastic modulus of the stainless steel is approximately 190 GPa, a coefficient of thermal conductivity of the stainless steel is approximately 16 W/m·K, and a density of the stainless steel is approximately 7.9 g/cm$^3$.

Components of the titanium alloy include but are not limited to TA4, TA18, and TC4. An elastic modulus of the titanium alloy is approximately 110 GPa, a coefficient of thermal conductivity of the titanium alloy is approximately 7 W/m·K to 14 W/m·K, and a density of the titanium alloy is approximately 4.5 g/cm$^3$.

The material of the second layer 2002 is, for example, aluminum alloy or copper alloy.

Components of the copper alloy include but are not limited to C1921, C1940, and pure copper. An elastic modulus of the copper alloy is approximately 110 GPa, a coefficient of thermal conductivity of the copper alloy is approximately 250 W/m·K to 380 W/m·K, and a density of the copper alloy is approximately 8.8 g/cm$^3$ to 8.9 g/cm$^3$.

Components of the aluminum alloy include but are not limited to 1xxx aluminum, 5xxx aluminum, and 6xxx aluminum. An elastic modulus of the aluminum alloy is approximately 69 GPa, a coefficient of thermal conductivity of the aluminum alloy is approximately 135 W/m·K to 220 W/m·K, and a density of the aluminum alloy is approximately 2.7 g/cm$^3$.

Specific materials and thickness ratios of the second layer and the first layer are not limited in this embodiment of this application. A person skilled in the art may select an appropriate material as the first layer and the second layer based on a requirement, and may also adjust thicknesses of the layers based on a requirement. All these fall within the protection scope of this application.

In an implementation of this application, as shown in Table 1 the first layer is made of a stainless steel material, and the second layer is made of an aluminum alloy material. A ratio of a thickness of the second layer to a total thickness of the supporting assembly is $1/5$ to $10/11$, an elastic modulus of the composite structure is 80.0 GPa to 165.8 GPa, a coefficient of thermal conductivity of the composite structure is 58.8 W/m·K to 210.5 W/m·K, and a density of the composite structure is 3.2 g/cm$^3$ to 6.9 g/cm$^3$.

Therefore, compared with that only the stainless steel is used in the conventional technology, the coefficient of thermal conductivity is increased by 42.8 W/m·K to 194.5 W/m·K, and the density s reduced by 1.0 g/cm$^3$ to 4.7 g/cm$^3$, so that heat dissipation performance of the supporting assembly is improved, and a weight of the supporting assembly is reduced at the same time. Compared with that only the aluminum alloy is used, the elastic modulus is increased by 11.0 GPa, a to 96.8 GPa, so that rigidity of the supporting assembly is increased, to help improve welding performance and formability of the supporting assembly.

TABLE 1

| Composite structure | Thickness ratio | Elastic modulus | Coefficient of thermal conductivity | Density |
|---|---|---|---|---|
| Stainless steel to aluminum alloy | 1:1 | 129.5 | 123.0 | 5.3 |
| | 1:2 | 109.3 | 158.7 | 4.4 |
| | 1:3 | 99.3 | 176.5 | 4.0 |
| | 1:4 | 93.2 | 187.2 | 3.7 |
| | 1:5 | 89.2 | 194.3 | 3.6 |
| | 1:6 | 86.3 | 199.4 | 3.4 |
| | 1:7 | 84.1 | 203.3 | 3.4 |
| | 1:8 | 82.4 | 206.2 | 3.3 |
| | 1:9 | 81.1 | 208.6 | 3.2 |
| | 1:10 | 80.0 | 210.5 | 3.2 |
| | 2:1 | 149.7 | 87.3 | 6.2 |
| | 2:3 | 117.4 | 144.4 | 4.8 |
| | 2:5 | 103.6 | 168.9 | 4.2 |
| | 2:7 | 95.9 | 182.4 | 3.9 |
| | 2:9 | 91.0 | 191.1 | 3.6 |
| | 4:1 | 165.8 | 58.8 | 6.9 |
| Titanium alloy to aluminum alloy | 1:1 | 89.5 | 118.5 | 3.6 |
| | 1:2 | 82.7 | 155.7 | 3.3 |
| | 2:1 | 96.3 | 81.3 | 3.9 |
| | 2:3 | 55.4 | 140.8 | 3.4 |
| | 2:5 | 80.7 | 166.3 | 3.2 |
| | 3:1 | 99.8 | 62.8 | 4.1 |
| | 4:1 | 101.8 | 51.6 | 4.1 |
| Titanium alloy to copper alloy | 1:1 | 110.0 | 193.5 | 6.7 |
| | 1:2 | 110.0 | 255.7 | 7.4 |
| | 1:3 | 110.0 | 286.8 | 7.8 |
| | 2:1 | 110.0 | 131.3 | 5.9 |
| | 3:1 | 110.0 | 100.3 | 5.6 |
| | 3:2 | 110.0 | 156.2 | 6.2 |
| | 7:1 | 110.0 | 53.6 | 5.1 |

For example, a ratio of a thickness of the first layer to a thickness of the second layer is 1:1, and the elastic modulus of the supporting assembly that uses the foregoing structure is 129.5 GPa, the coefficient of thermal conductivity is 123 W/m·K, and the density is 5.3 g/cm$^3$.

Therefore, compared with that only the stainless steel is used in the conventional technology, the coefficient of thermal conductivity is increased by 107 W/m·K, and the density is reduced by 2.6 g/cm$^3$, so that heat dissipation performance of the supporting assembly is improved, and a weight of the supporting assembly is reduced at the same time. Compared with that only the aluminum alloy is used, the elastic modulus is increased by 60.5 GPa, so that rigidity of the supporting assembly is increased, to help improve welding performance and formability of the supporting assembly.

In another implementation of this application, as shown in Table 1. The first layer is made of a titanium alloy material, and the second layer is made of an aluminum alloy material. A ratio of a thickness of the second layer to a total thickness of the supporting assembly is ⅕ to 5/7, an elastic modulus of the composite structure is 80.7 GPa to 101.8 GPa, a coefficient of thermal conductivity of the composite structure is 51.6 W/m·K to 166.3 W/m·K, and a density of the composite structure is 3.2 g/cm$^3$ to 4.1 g/cm$^3$.

Therefore, compared with that only the titanium alloy is used in the conventional technology, the coefficient of thermal conductivity is increased by 44.6 W/m·K to 159.3 W/m·K, and the density is reduced by 0.4 g/cm$^3$ to 1.3 g/cm$^3$, so that heat dissipation performance of the supporting assembly is improved, and a weight of the supporting assembly is reduced at the same time. Compared with that only the aluminum alloy is used, the elastic modulus is increased by 11.7 GPa to 32.8 GPa, so that rigidity of the supporting assembly is increased, to help improve welding performance and formability of the supporting assembly.

For example, a ratio of a thickness of the first layer to a thickness of the second layer is 1:1, and the elastic modulus of the supporting assembly that uses the foregoing structure is 89.5 GPa, the coefficient of thermal conductivity is 118.5 W/m·K, and the density is 3.6 g/cm$^3$.

Therefore, compared with that only the titanium alloy is used in the conventional technology, the coefficient of thermal conductivity is increased by 111.5 W/m. K, and the density is reduced by 0.9 g/cm$^3$, so that heat dissipation performance of the supporting assembly is improved, and a weight of the supporting assembly is reduced at the same time. Compared with that only the aluminum alloy is used, the elastic modulus is increased by 20.5 GPa, so that rigidity of the supporting assembly is increased, to help improve welding performance and formability of the supporting assembly.

In another implementation of this application, as shown in Table 1, the first layer is made of a titanium alloy material, and the second layer is made of a copper alloy material. A ratio of a thickness of the second layer to a total thickness of the supporting assembly is ⅛ to ¾, an elastic modulus of the composite structure is 110.0 GPa, a coefficient of thermal conductivity of the composite structure is 53.6 W/m·K to 286.8 W/m·K, and a density of the composite structure is 5.1 g/cm$^3$ to 7.8 g/cm$^3$.

Therefore, compared with that only the titanium alloy is used in the conventional technology, the coefficient of thermal conductivity is increased by 46.6 W/m·K to 279.8 W/m·K, and the density is reduced by 0.6 g/cm$^3$ to 3.3 g/cm$^3$, so that heat dissipation performance of the supporting assembly is improved, and a weight of the supporting assembly is reduced at the same time. Compared with that only the copper alloy is used, the elastic modulus remains unchanged.

For example, a ratio of a thickness of the first layer to a thickness of the second layer is 1:1, and the elastic modulus of the supporting assembly that uses the foregoing structure is 110 GPa, the coefficient of thermal conductivity is 193.5 W/m·K, and the density is 6.6 g/cm$^3$.

Therefore, compared with that only the titanium alloy is used in the conventional technology, the coefficient of thermal conductivity is increased by 186.5 W/m·K and heat dissipation performance of the supporting assembly is improved. Compared with that only the copper alloy is used, the elastic modulus remains unchanged, and the density is reduced by 2.2 g/cm$^3$, so that a weight of the supporting assembly is reduced.

In the supporting assembly provided in this embodiment of this application, both the first supporting component and the second supporting component are made of a composite material, so that requirements for heat dissipation, rigidity, and a light weight of the supporting assembly can all be met. This helps reduce mass of the foldable display terminal, and also improve welding performance, formability, and supporting stability of the supporting assembly; to further improve heat dissipation performance and impact resistance of the foldable display terminal.

The first layer is adjacent to a non-display surface of the flexible display, and the second layer is adjacent to the first layer.

The first layer and the second layer, for example, each include a first surface and a second surface opposite to each other, where the first surface of the first layer is close to the non-display surface of the flexible display, the second surface of the first layer is away from the non-display surface of the flexible display, the first surface of the second layer is close to the second surface of the first layer, and the second surface of the second layer is away from the second surface of the first layer.

A connection manner of the first layer is not limited in this embodiment of this application. For example, the first surface of the first layer, for example, may be connected to the flexible display in a bonding manner.

The second surface of the first layer, for example, may be connected to the first surface of the second layer by using an atom bonding process.

In a process of connecting the first layer to a first heating layer by using the atom bonding process, oxide layers on the first surface of the second layer and on the second surface of the first layer may be first removed by using a plasma cleaner. Then, the first surface of the second layer may be connected to the second surface of the first layer in a manner of vacuum hot rolling, vacuum cold rolling, or vacuum diffusion welding.

In this way, the connection between the first layer and the first heating layer is tighter, and reliability of the supporting assembly is improved.

Figure 8:
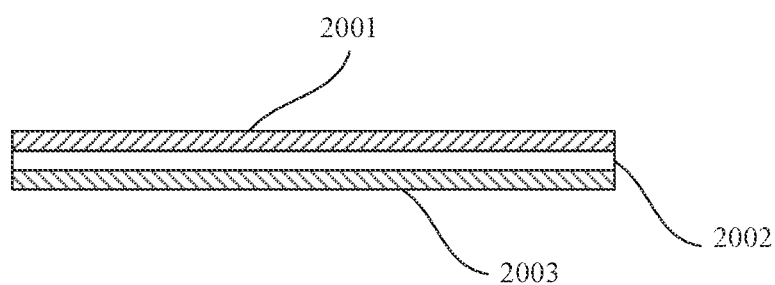
FIG. 8 is a schematic diagram of a structure of another supporting assembly according to an embodiment of this application.

The foregoing supporting assembly is provided with a first connecting member only on a side close to the flexible display, and on a side away from the flexible display, there is only a first heat dissipation member. Consequently, strength of the supporting assembly on the side away from the flexible display is relatively low. To further improve rigidity, welding performance, formability, and supporting stability of the supporting assembly, as shown in FIG. 8, the supporting assembly further includes a third layer 2003 that is disposed adjacent to the second surface of the second layer 2002.

The third layer 2003, for example, includes a first surface and a second surface opposite to each other, where a first surface of the third layer is disposed adjacent to the second surface of the second layer, and the second surface of the third layer is away from the second layer.

The third layer 2003 is connected to the second surface of the second layer by using the atom bonding process.

In a process of connecting the third layer to the first heating layer by using the atom bonding process, oxide layers on the second surface of the second layer and on the first surface of the third layer may be first removed by using a plasma cleaner. Then, the second surface of the second layer may be connected to the first surface of the third layer in a manner of vacuum hot rolling, vacuum cold rolling, or vacuum diffusion welding.

An elastic modulus of the third layer is greater than or equal to an elastic modulus of the first layer.

For example, a material of the third layer is stainless steel, titanium alloy, or copper alloy. Refer to the foregoing for performance parameters of the stainless steel, the titanium alloy, and the copper alloy. Details are not described herein again.

A specific material and thickness ratio of the third layer are not limited in this embodiment of this application. A person skilled in the art may select an appropriate material as the third layer based on a requirement, and may also adjust thicknesses of the layers based on a requirement. All these fall within the protection scope of this application.

In an implementation of this application, as shown in Table 2, the third layer 2003 may use a material the same as that of the first layer 2001.

TABLE 2

| Composite structure | Thickness ratio | Elastic modulus | Coefficient of thermal conductivity | Density |
|---|---|---|---|---|
| Stainless steel to aluminum alloy to stainless steel | 1:1:1 | 149.7 | 87.3 | 6.2 |
| | 1:2:1 | 129.5 | 123.0 | 5.3 |
| | 1:3:1 | 117.4 | 144.4 | 4.8 |
| | 1:4:1 | 109.3 | 158.7 | 4.4 |
| | 1:20:1 | 80.0 | 210.5 | 3.2 |
| | 2:1:2 | 165.8 | 58.8 | 6.9 |
| | 1:1:2 | 159.8 | 69.5 | 6.6 |
| | 1:2:2 | 141.6 | 101.6 | 5.8 |
| Titanium alloy to copper alloy to titanium alloy | 1:1:1 | 110.0 | 131.3 | 5.9 |
| | 1:2:1 | 110.0 | 193.5 | 6.7 |
| | 2:1:2 | 110.0 | 81.6 | 5.4 |
| | 1:1:2 | 110.0 | 100.2 | 5.6 |
| | 1:2:2 | 110.0 | 156.2 | 6.2 |
| | 1:6:1 | 110.0 | 286.8 | 7.8 |
| | 4:1:3 | 110.0 | 53.6 | 5.1 |
| Titanium alloy to aluminum alloy to titanium alloy | 1:1:1 | 96.3 | 81.3 | 3.9 |
| | 1:2:1 | 89.5 | 118.5 | 3.6 |
| | 1:3:1 | 85.4 | 140.8 | 3.4 |
| | 1:4:1 | 82.7 | 155.7 | 3.3 |
| | 2:1:2 | 101.8 | 51.6 | 4.1 |
| | 1:1:2 | 99.8 | 62.8 | 4.1 |
| | 1:2:2 | 93.6 | 96.2 | 3.8 |
| | 1:5:1 | 80.7 | 166.3 | 3.2 |

For example, the first layer is made of a stainless steel material, the second layer is made of an aluminum alloy material, and the third layer is made of a stainless steel material. A ratio of a thickness of the second layer to a total thickness of the supporting assembly is 1/5 to 10/11, an elastic modulus of the composite structure is 80.0 GPa to 165.8 GPa, a coefficient of thermal conductivity of the composite structure is 58.8 W/m·K to 210.5 W/m·K, and a density of the composite structure is 3.2 $g/cm^3$ to 6.9 $g/cm^3$.

Therefore, compared with that the foregoing supporting assembly with only the first layer made of the stainless steel material and the second layer made of the aluminum alloy material is used, the elastic modulus remains unchanged. However, because the third layer is disposed on a side of the second layer that is away from the first layer, rigidity of the supporting assembly at this location is increased. This helps improve welding performance and formability of the supporting assembly.

Thicknesses of the first layer and the third layer may be the same or different. This is not limited in this application.

Specific combination manners include but are not limited to the following thickness ratios:

A thickness ratio of the first layer, the second layer, and the third layer is 1:1:1, 1.1:2, 1:2:1, 1:2:2, 1:3:1, 1:4:1, or 2:1:2.

In an implementation of this application, the thicknesses of the first layer and the third layer are the same. For example, the thickness ratio of the first layer, the second layer, and the third layer is 1:1:1. The elastic modulus of the supporting assembly that uses the foregoing structure is 149.7 GPa, the coefficient of thermal conductivity is 87.3 W/m·K, and the density is 6.2 $g/cm^3$.

Therefore, compared with that the foregoing supporting assembly with only the first layer made of the stainless steel material and the second layer made of the aluminum alloy material is used, where the ratio of the thickness of the first layer to the thickness of the second layer is 1:1, the elastic modulus is increased by 20.2 GPa, so that rigidity of the supporting assembly is increased, to help improve welding performance and formability of the supporting assembly.

In another implementation of this application, the thicknesses of the first layer and the third layer are different. For example, the thickness ratio of the first layer, the second layer, and the third layer is 1:1:2. The elastic modulus of the supporting assembly that uses the foregoing structure is 159.8 GPa, the coefficient of thermal conductivity is 69.5 W/m·K, and the density is 6.6 g/cm³.

Therefore, compared with that the foregoing supporting assembly with only the first layer made of the stainless steel material and the second layer made of the aluminum alloy material is used, where the ratio of the thickness of the first layer to the thickness of the second layer is 1:1, the elastic modulus is increased by 30.3 GPa, so that rigidity of the supporting assembly is increased, to help improve welding performance and formability of the supporting assembly.

For example, the first layer is made of a titanium alloy material, the second layer is made of a copper alloy material, and the third layer is made of a titanium alloy material. A ratio of a thickness of the second layer to a total thickness of the composite structure is ⅛ to ¾ an elastic modulus of the composite structure is 110 GPa, a coefficient of thermal conductivity of the composite structure is 53.6 W/m·K to 286.8 W/m·K, and a density of the composite structure is 5.1 g/cm³ to 7.8 g/cm³.

The thicknesses of the first layer and the third layer may be the same or different. This is not limited in this application.

Specific combination manners include but are not limited to the following thickness ratios:

A thickness ratio of the first layer, the second layer, and the third layer is 1:1:1, 1.1:2, 1:2:1, 1:2:2, or 2:1:2.

In an implementation of this application, the thicknesses of the first layer and the third layer are the same. For example, the thickness ratio of the first layer, the second layer, and the third layer is 1:1:1. The elastic modulus of the supporting assembly that uses the foregoing structure is 110 GPa, the coefficient of thermal conductivity is 131.3 W/m·K, and the density is 5.9 g/cm³.

Therefore, compared with that the foregoing supporting assembly with only the first layer made of the titanium alloy material and the second layer made of the copper alloy material is used, where the ratio of the thickness of the first layer to the thickness of the second layer is 1:1, the elastic modulus remains unchanged. However, because the third layer is disposed on a side of the second layer that is away from the first layer, rigidity of the supporting assembly at this location is increased. This helps improve welding performance and formability of the supporting assembly.

In another implementation of this application, the thicknesses of the first layer and the third layer are different. For example, the thickness ratio of the first layer, the second layer, and the third layer is 1:1:2. The elastic modulus of the supporting assembly that uses the foregoing structure is 110.0 GPa, the coefficient of thermal conductivity is 100.2 W/m·K, and the density is 5.6 g/cm³.

Therefore, compared with that the foregoing supporting assembly with only the first layer made of the titanium alloy material and the second layer made of the copper alloy material is used, where the ratio of the thickness of the first layer to the thickness of the second layer is 1:1, the elastic modulus remains unchanged. However, because the third layer is disposed on a side of the second layer that is away from the first layer, rigidity of the supporting assembly at this location is increased. This helps improve welding performance and formability of the supporting assembly.

For example, the first layer is made of a titanium alloy material, the second layer is made of an aluminum alloy material, and the third layer is made of a titanium alloy material. A ratio of a thickness of the second layer to a total thickness of the supporting assembly is ⅕ to ⅝, an elastic modulus of the composite structure is 80.7 GPa to 101.8 GPa, a coefficient of thermal conductivity of the composite structure is 51.6 W/m·K to 166.3 W/m·K, and a density of the composite structure is 3.2 g/cm³ to 4.1 g/cm³.

The thicknesses of the first layer and the third layer may be the same or different. This is not limited in this application.

Specific combination manners include but are not limited to the following thickness ratios:

A thickness ratio of the first layer, the second layer, and the third layer is 1:1:1, 1.1:2, 1:2:1, 1:2:2, 1:3:1, 1:4:1, or 2:1:2.

In an implementation of this application, the thicknesses of the first layer and the third layer are the same. For example, the thickness ratio of the first layer, the second layer, and the third layer is 1:1:1. The elastic modulus of the supporting assembly that uses the foregoing structure is 96.3 GPa, the coefficient of thermal conductivity is 81.3 W/m·K, and the density is 39 g/cm³.

Therefore, compared with that the foregoing supporting assembly with only the first layer made of the titanium alloy material and the second layer made of the aluminum alloy material is used, where the ratio of the thickness of the first layer to the thickness of the second layer is 1:1, the elastic modulus is increased by 6.8 GPa, so that rigidity of the supporting assembly is increased, to help improve welding performance and formability of the supporting assembly.

In another implementation of this application, the thicknesses of the first layer and the third layer are different. For example, the thickness ratio of the first layer, the second layer, and the third layer is 1:1:2. The elastic modulus of the supporting assembly that uses the foregoing structure is 99.8 GPa, the coefficient of thermal conductivity is 62.8 W/m·K, and the density is 4.1 g/cm³.

Therefore, compared with that the foregoing supporting assembly with only the first layer made of the titanium alloy material and the second layer made of the aluminum alloy material is used, where the ratio of the thickness of the first layer to the thickness of the second layer is 1:1, the elastic modulus is increased by 10.3 GPa, so that rigidity of the supporting assembly is increased, to help improve welding performance and formability of the supporting assembly.

In another implementation of this application, as shown in Table 3, the third layer 2003 may be made of a material different from those of the first layer 2001 and the second layer 2002.

TABLE 3

| Composite structure | Thickness ratio | Elastic modulus | Coefficient of thermal conductivity | Density |
|---|---|---|---|---|
| Stainless steel to aluminum alloy to titanium alloy | 2:1:2 | 133.8 | 55.2 | 5.5 |
| | 1:1:1 | 123.0 | 84.3 | 5.0 |
| | 1:2:1 | 109.5 | 120.8 | 4.5 |
| | 1:3:1 | 101.4 | 142.6 | 4.1 |
| | 1:4:1 | 96.0 | 157.2 | 3.9 |
| | 1:5:1 | 92.1 | 167.6 | 3.7 |
| | 1:6:1 | 89.3 | 175.4 | 3.6 |
| | 1:7:1 | 87.0 | 181.4 | 3.5 |
| | 1:8:1 | 85.2 | 186.3 | 3.4 |
| | 1:9:1 | 83.7 | 190.3 | 3.3 |
| | 1:10:1 | 82.5 | 193.6 | 3.3 |
| Stainless steel to aluminum alloy to copper alloy | 1:1:1 | 123.0 | 208.7 | 6.5 |
| | 1:2:1 | 109.5 | 214.0 | 5.5 |
| | 1:3:1 | 101.4 | 217.2 | 5.0 |
| | 1:4:1 | 96.0 | 219.3 | 4.6 |
| | 1:5:1 | 92.1 | 220.9 | 4.3 |

TABLE 3-continued

| Composite structure | Thickness ratio | Elastic modulus | Coefficient of thermal conductivity | Density |
|---|---|---|---|---|
| | 1:6:1 | 89.3 | 222.0 | 4.1 |
| | 1:7:1 | 87.0 | 222.9 | 4.0 |

For example, as shown in Table 3, the first layer is made of a stainless steel material, the second layer is made of an aluminum alloy material, and the third layer is made of a titanium alloy material. A ratio of a thickness of the second layer to a total thickness of the supporting assembly is 1/5 to 5/6, an elastic modulus of the composite structure is 82.5 GPa to 133.8 GPa, a coefficient of thermal conductivity of the composite structure is 55.2.6 W/m·K to 193.6 W/m·K, and a density of the composite structure is 3.3 g/cm³ to 5.5 g/cm³.

The thickness ratio of the first layer, the second layer, and the third layer is 1:2:1. The elastic modulus of the supporting assembly that uses the foregoing structure is 133.8 GPa, the coefficient of thermal conductivity is 55.2 W/m·K, and the density is 5.5 g/cm³.

Therefore, compared with that the foregoing supporting assembly with only the first layer made of the stainless steel material and the second layer made of the aluminum alloy material is used, where the ratio of the thickness of the first layer to the thickness of the second layer is 1:1, the elastic modulus is increased by 4.5 GPa, so that rigidity of the supporting assembly is increased, to help improve welding performance and formability of the supporting assembly.

For example, still refer to Table 3. The first layer is made of a stainless steel material, the second layer is made of an aluminum alloy material, and the third layer is made of a copper alloy material. A ratio of a thickness of the second layer to a total thickness of the supporting assembly is 1/3 to 7/9, an elastic modulus of the composite structure is 87.0 GPa to 1230 GPa, a coefficient of thermal conductivity of the composite structure is 208.7 W/m·K to 222.9 W/m·K, and a density of the composite structure is 4.0 g/cm³ to 6.5 g/cm³.

The thickness ratio of the first layer, the second layer, and the third layer is 1:1:1. The elastic modulus of the supporting assembly that uses the foregoing structure is 123 GPa, the coefficient of thermal conductivity is 208 W/m·K, and the density is 6.5 g/cm³.

Therefore, compared with that the foregoing supporting assembly with only the first layer made of the stainless steel material and the second layer made of the aluminum alloy material is used, where the ratio of the thickness of the first layer to the thickness of the second layer is 1:1, the elastic modulus is reduced by 6.5 GPa. However, because the third layer is disposed on a side of the second layer that is away from the first layer, rigidity of the supporting assembly at this location is increased. This helps improve a thermal conductivity property of the supporting assembly at the same time.

Figure 9:
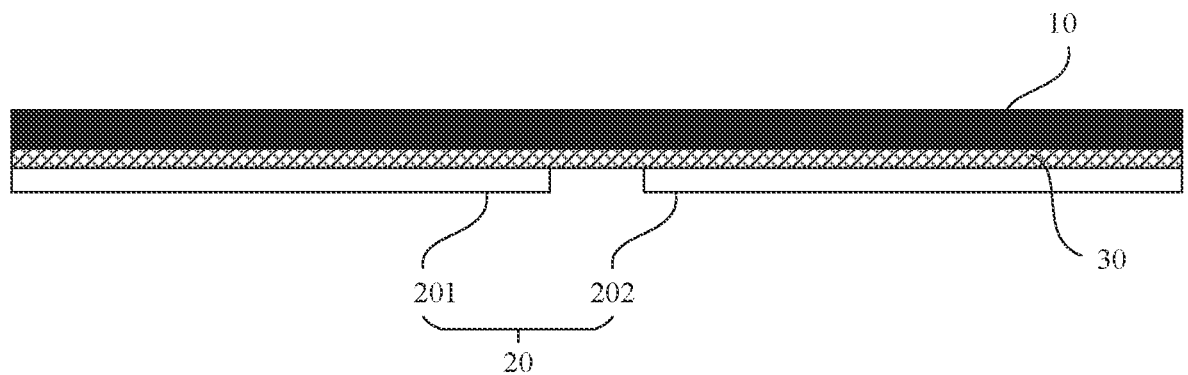
FIG. 9 is a schematic diagram of a structure of another foldable display terminal according to an embodiment of this application.

An embodiment of this application further provides a foldable display terminal. FIG. 9 is a schematic diagram of a structure of another foldable display terminal according to an embodiment of this application. As shown in FIG. 9, a non-display surface of the flexible display 10 is further provided with a stainless steel sheet 30.

Figure 10:
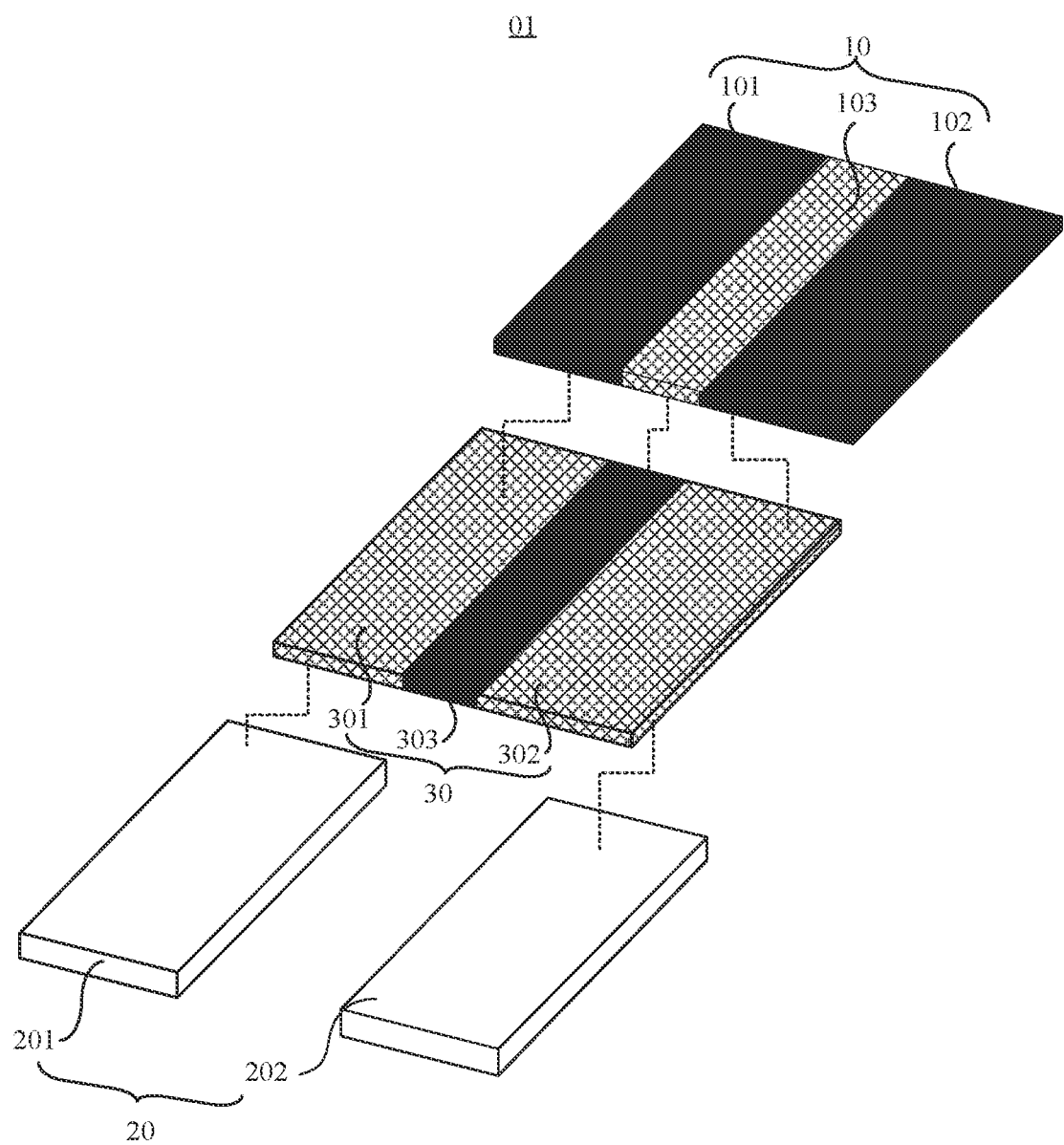
FIG. 10 is an exploded view of another foldable display terminal according to an embodiment of this application.

FIG. 10 is an exploded view of another foldable display terminal according to an embodiment of this application. As shown in FIG. 10, the stainless steel sheet 30 includes a first fixed part 301 connected to the first non-bending region 101, a second fixed part 302 connected to the second non-bending region 102, and a bending part 303 connected to the bending region 103. Therefore, the stainless steel sheet can support not only the first non-bending region and the second non-bending region of the flexible display, but also the bending region of the flexible display, to ensure that bendability of the bending region of the flexible display can meet a requirement when rigidity and impact resistance of the bending region are increased.

The first fixed part 301, the second fixed part 302, and the bending part 303 are integrally formed.

The first supporting component 201 of the supporting assembly is connected to the first fixed part 301, and the second supporting component 202 of the supporting assembly is connected to the second fixed part 302.

The stainless steel sheet 30, for example, includes a first surface and a second surface opposite to each other. The first surface of the stainless steel sheet 30, for example, is connected to the flexible display 10 in a bonding manner. The second surface of the stainless steel sheet 30, for example, may be connected to the supporting assembly 20 in a manner of welding or adhesion by using grid adhesive. In this way, stability of a connection between the supporting assembly and the stainless steel sheet is improved.

In the foldable display terminal provided in this embodiment of this application, the stainless steel sheet is disposed between the flexible display and the supporting assembly, so that rigidity and impact resistance of the flexible display are further increased.

The foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A composite structure configured to support a flexible display and comprising:
    a first titanium alloy layer comprising:
        a first surface proximate to the flexible display; and
        a second surface opposite to the first surface; and
    a second layer stacked with the first layer and configured to dissipate heat, wherein the second layer comprises:
        a third surface proximate to the second surface; and
        a fourth surface opposite to the third surface;
    wherein the first layer is configured to couple the second layer with the flexible display,
    wherein a first elastic modulus of the first layer is greater than or equal to a second elastic modulus of the second layer, and
    wherein a first coefficient of thermal conductivity of the first layer is less than or equal to a second coefficient of thermal conductivity of the second layer.

2. The composite structure of claim 1, wherein the second layer comprises aluminum alloy, and wherein the third surface is coupled to the second surface using an atom bonding process.

3. The composite structure of claim 1, wherein the second layer comprises aluminum alloy, wherein a ratio of a thickness of the second layer to a total thickness of the composite structure is 1/5 to 10/11, wherein a third elastic modulus of the composite structure is 80.0 gigapascals (GPa) to 165.8 GPa, wherein a third coefficient of thermal conductivity of the composite structure is 58.8 watts per meter per kelvin (W/m·K) to 210.5 W/m·K, and wherein a density of the composite structure is 3.2 grams per cubic centimeter (g/cm$^3$) to 6.9 g/cm$^3$.

4. The composite structure of claim 1, wherein the second layer comprises aluminum alloy, wherein a ratio of a thickness of the second layer to a total thickness of the composite structure is 1/5 to 5/7, wherein a third elastic modulus of the composite structure is 80.7 gigapascals (GPa) to 101.8 GPa, wherein a third coefficient of thermal conductivity of the composite structure is 51.6 watts per meter per kelvin (W/m·K) to 166.3 W/m·K, and wherein a density of the composite structure is 3.2 grams per cubic centimeter (g/cm$^3$) to 4.1 g/cm$^3$.

5. The composite structure of claim 1, wherein of the second layer comprises copper alloy, wherein a ratio of a thickness of the second layer to a total thickness of the composite structure is 1/8 to 3/4, wherein a third elastic modulus of the composite structure is 110.0 gigapascals (GPa), wherein a third coefficient of thermal conductivity of the composite structure is 53.6 watts per meter per kelvin (W/m·K) to 286.8 W/m·K, and wherein a density of the composite structure is 5.1 grams per cubic centimeter (g/cm$^3$) to 7.8 g/cm$^3$.

6. The composite structure of claim 1, further comprising a third layer configured to support the second layer and disposed adjacent to the fourth surface, wherein a fourth elastic modulus of the third layer is greater than or equal to the second elastic modulus.

7. The composite structure of claim 6, wherein third layer comprises stainless steel, titanium alloy, or copper alloy, and wherein the third layer is coupled to the fourth surface using an atom bonding process.

8. The composite structure of claim 6, wherein the second layer comprises aluminum alloy, wherein the third layer comprises stainless steel, wherein a ratio of a thickness of the second layer to a total thickness of the composite structure is 1/5 to 10/11, wherein a third elastic modulus of the composite structure is 80.0 gigapascals (GPa) to 165.8 GPa, wherein a third coefficient of thermal conductivity of the composite structure is 58.8 watts per meter per kelvin (W/m·K) to 210.5 W/m·K, and wherein a density of the composite structure is 3.2 grams per cubic centimeter (g/cm$^3$) to 6.9 g/cm$^3$.

9. The composite structure of claim 8, wherein a thickness ratio of the first layer, the second layer, and the third layer is 1:1:1, 1:1:2, 1:2:1, 1:2:2, 1:3:1, 1:4:1, or 2:1:2.

10. The composite structure of claim 6, wherein the second layer comprises copper alloy, wherein the third layer comprises titanium alloy, wherein a ratio of a thickness of the second layer to a total thickness of the composite structure is 1/8 to 3/4, wherein a third elastic modulus of the composite structure is 110 gigapascals (GPa), wherein a third coefficient of thermal conductivity of the composite structure is 53.6 watts per meter per kelvin (W/m·K) to 286.8 W/m·K, and wherein a density of the composite structure is 5.1 grams per cubic centimeter (g/cm$^3$) to 7.8 g/cm$^3$.

11. The composite structure of claim 10, wherein a thickness ratio of the first layer, the second layer, and the third layer is 1:1:1, 1:1:2, 1:2:1, 1:2:2, or 2:1:2.

12. The composite structure of claim 6, wherein the second layer comprises aluminum alloy, wherein a third material of the third layer comprises titanium alloy, wherein a ratio of a thickness of the second layer to a total thickness of the composite structure is 1/5 to 5/7, wherein a third elastic modulus of the composite structure is 80.7 gigapascals (GPa) to 101.8 GPa, wherein a third coefficient of thermal conductivity of the composite structure is 51.6 watts per meter per kelvin (W/m·K) to 166.3 W/m·K, and wherein a density of the composite structure is 3.2 grams per cubic centimeter (g/cm$^3$) to 4.1 g/cm$^3$.

13. The composite structure of claim 12, wherein a thickness ratio of the first layer, the second layer, and the third layer is 1:1:1, 1:1:2, 1:2:1, 1:2:2, 1:3:1, 1:4:1, or 2:1:2.

14. The composite structure of claim 6, wherein the second layer comprises aluminum alloy, wherein the third layer comprises titanium alloy, wherein a ratio of a thickness of the second layer to a total thickness of the composite structure is 1/5 to 5/6, wherein a third elastic modulus of the composite structure is 82.5 gigapascals (GPa) to 133.8 GPa, wherein a third coefficient of thermal conductivity of the composite structure is 55.2.6 watts per meter per kelvin (W/m·K) to 193.6 W/m·K, and wherein a density of the composite structure is 3.3 grams per cubic centimeter (g/cm$^3$) to 5.5 g/cm$^3$.

15. The composite structure of claim 6, wherein the second layer comprises aluminum alloy, wherein the third layer comprises copper alloy, wherein a ratio of a thickness of the second layer to a total thickness of the composite structure is 1/3 to 7/8, wherein a third elastic modulus of the composite structure is 87.0 gigapascals (GPa) to 123.0 GPa, wherein a third coefficient of thermal conductivity of the composite structure is 208.7 watts per meter per kelvin (W/m·K) to 222.9 W/m·K, and wherein a density of the composite structure is 4.0 grams per cubic centimeter (g/cm$^3$) to 6.5 g/cm$^3$.

16. The composite structure of claim 1, wherein the second layer comprises copper alloy, and wherein the third surface is coupled to the second surface using an atom bonding process.

17. A flexible display assembly comprising:
a flexible display;
a first supporting component; and
a second supporting component,
wherein the first supporting component and the second supporting component have a composite structure comprising:
a first titanium alloy layer comprising:
a first surface proximate to the flexible display; and
a second surface opposite to the first surface; and
a second layer stacked with the first layer and configured to dissipate heat, wherein the second layer comprise:
a third surface proximate to the second surface; and
a fourth surface opposite to the third surface,
wherein the first layer is configured to couple the second layer with the flexible display,
wherein a first elastic modulus of the first layer is greater than or equal to a second elastic modulus of the second layer, and
wherein a first coefficient of thermal conductivity of the first layer is less than or equal to a second coefficient of thermal conductivity of the second layer.

18. A foldable display terminal comprising:
a flexible display assembly comprising:
a flexible display comprising:
a first non-bending region;
a second non-bending region; and
a bending region located between the first non-bending region and the second non-bending region;
a first supporting component coupled to the first non-bending region; and a second supporting component coupled to the second non-bending region, wherein the first supporting component and the second supporting component have a composite structure comprising:

a first titanium alloy layer comprising:
a first surface proximate to the flexible display; and
a second surface opposite to the first surface; and a second layer stacked with the first layer and configured to dissipate heat, wherein the second layer comprises:
a third surface proximate to the second surface; and
a fourth surface opposite to the third surface, wherein the first layer is configured to couple the second layer with the flexible display, wherein a first elastic modulus of the first layer is greater than or equal to a second elastic modulus of the second layer, and wherein a first coefficient of thermal conductivity of the first layer is less than or equal to a second coefficient of thermal conductivity of the second layer.

19. The foldable display terminal of claim 18, further comprising a stainless steel sheet disposed on the flexible display and comprising:

a first fixed part coupled to the first non-bending region and the first supporting component;
a second fixed part coupled to the second non-bending region and the second supporting component; and
a bending part coupled to the bending region,
wherein the first fixed part, the second fixed part, and the bending part are integral.

20. The foldable display terminal of claim 19, wherein the stainless steel sheet is bonded to the flexible display, and wherein the first supporting component and the second supporting component are bonded or welded to the stainless steel sheet.

* * * * *